US 6,710,991 B2

(12) United States Patent
Kato

(10) Patent No.: US 6,710,991 B2
(45) Date of Patent: Mar. 23, 2004

(54) ELECTROSTATIC-BREAKDOWN-PREVENTIVE AND PROTECTIVE CIRCUIT FOR SEMICONDUCTOR-DEVICE

(75) Inventor: Katsuhiro Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/305,954

(22) Filed: Nov. 29, 2002

(65) Prior Publication Data

US 2003/0222673 A1 Dec. 4, 2003

(30) Foreign Application Priority Data

May 28, 2002 (JP) ........................................ 2002-153504

(51) Int. Cl.$^7$ ............................ H02H 3/20; H01L 23/62
(52) U.S. Cl. ............................ 361/56; 361/91; 361/111; 361/118; 257/355; 257/357; 326/47; 326/101
(58) Field of Search .................... 326/47, 101; 361/56, 361/91, 111, 118; 257/355, 357, 23.13

(56) References Cited

U.S. PATENT DOCUMENTS

| 5,416,661 | A | * | 5/1995 | Furuta ........................... 361/56 |
| 5,905,287 | A | * | 5/1999 | Hirata .......................... 257/355 |
| 6,385,116 | B2 | * | 5/2002 | Wang ........................... 365/226 |
| 6,556,409 | B1 | * | 4/2003 | Chittipeddi et al. ........ 361/111 |

FOREIGN PATENT DOCUMENTS

| JP | 56-061082 | 5/1981 |
| JP | 60-202596 | 10/1985 |
| JP | 02-028362 | 1/1990 |
| JP | 03-286495 | 12/1991 |
| JP | 04-182985 | 6/1992 |
| JP | 07-085676 | 3/1995 |
| JP | 07-114794 | 5/1995 |
| JP | 09-027740 | 1/1997 |
| JP | 09-172146 | 6/1997 |
| JP | 04-111350 | 4/1998 |

* cited by examiner

Primary Examiner—Vibol Tan
(74) Attorney, Agent, or Firm—Volentine Francos, PLLC

(57) ABSTRACT

The present invention provides a compact electrostatic-breakdown-preventive and protective circuit for a semiconductor-device capable of performing high-speed operations. In the electrostatic-breakdown-preventive and protective circuit for a semiconductor-device of the invention, a protective transistor is provided between a power-source line and a ground line for an input/output circuit, a position between a power-source line and ground line for a circuit block A, a position between a power-source line and a ground line for a circuit block B, and a position between a power-source line and a ground line for an input/output circuit. A PMOS protective transistor is provided between the power-source line for the circuit block A and the power-source line for the circuit block B, and an NMOS protective transistor is provided between the ground lines in an internal-circuit region in the vicinity of a signal line (protective resistor).

11 Claims, 15 Drawing Sheets

EQUIVALENT CIRCUIT

ELECTROSTATIC-BREAKDOWN-PREVENTIVE AND PROTECTIVE CIRCUIT FOR SEMICONDUCTOR-DEVICE

BACKGROUND OF THE INVENTION

1. Field of the Invention

The present invention relates to an electrostatic-breakdown-preventive and protective circuit for a semiconductor-device provided with power-source lines and ground lines dedicated to a plurality of internal logic circuits.

2. Description of the Related Art

In recent years, a semiconductor integrated-circuit device (may be hereafter referred to as a semiconductor device or a device) uses an internal circuit by driving it with a dedicated power source line and ground line for each functional block. Because an operating voltage is lowered, a noise-malfunction margin tends to decrease. For example, when a specific circuit block switches to a state of consuming much power, a drop of a power-source voltage due to the above state propagates to power-source lines of another circuit block to prevent a circuit block to be easily influenced by the voltage drop from malfunctioning. This type of the device has a problem that it easily causes an electrostatic breakdown. This is described below by using an example of providing independent power-source line and ground line dedicated to an internal circuit for two circuit blocks.

FIG. 12 shows a layout image diagram on the device chip of a conventional semiconductor-device electrostatic-breakdown-preventive and protective circuit. FIG. 13 shows a circuit diagram of the conventional semiconductor-device electrostatic-breakdown-preventive and protective circuit. As shown in FIGS. 12 and 13, a conventional semiconductor-device electrostatic-breakdown-preventive and protective circuit uses a semiconductor device 100 in which a circuit block A101 (internal-circuit region A) and a circuit block B102 (internal-circuit region B) have an equal supply potential but they have power-source systems independent from each other and the power-source system of an input/output circuit 103 (input/output circuit region) is independent, and an inverter 20 connected to a circuit block A is constituted so as to receive an output of an inverter 30 connected to the circuit block B102 as an input signal through a signal line (wiring resistor) 25.

In a circuit having the configuration of a pair of output and input for interfacing the above two circuit blocks each other, when an electrostatic surge is applied between a power-source line 21 for the circuit block A101 (region A) and a ground line 32 for the circuit block B102 (region B), the gate (oxide film) of a P-channel MOS (Metal-Oxide Semiconductor which is hereafter referred to as PMOS) transistor 23 constituting the inverter 20 is easily broken down. Because there is not a route for an electrostatic surge to pass from the power-source line 21 for the circuit block A101 to the ground line 32 for the circuit block B102, the electrostatic surge flows through gates of the N-channel MOS (Metal-Oxide Semiconductor which is hereafter referred to as NMOS) 34 of the inverter 30 and the PMOS transistor 23 of the inverter 20. Even if an electrostatic surge is applied between the power-source line 31 for the circuit block B102 and the ground line 22 for the circuit block A101 or between the power-source line 21 for the circuit block A101 and the power-source line 31 for the circuit block B102, the PMOS transistor 23 constituting the inverter 20 or the gate (oxide film) of the NMOS transistor 24 is broken down because there is not a route through which the electrostatic surge passes. To settle this type of problem, an improved protective circuit is used.

FIG. 14 shows a layout image diagram on the device chip of a conventional improved semiconductor-device electrostatic-breakdown-preventive and protective circuit. FIG. 15 shows a circuit diagram of a conventional improved semiconductor-device electrostatic-breakdown-preventive and protective circuit. In the conventional semiconductor-device electrostatic-breakdown-preventive and protective circuit, by setting a protective transistor 10 between a power-source line 11 and a ground line 12 for an input/output circuit 103 set to the circumferential portion of a device chip, setting protective transistors 26 and 28 between the power-source line 11 and ground line 12 for the input/output circuit 103 and a position between the power-source line 21 and ground line 22 for the circuit block A101 respectively, and moreover setting protective transistors 27 and 29 between the power-source line 11 and ground line 12 for the input/output circuit 103 and a position between the power-source line 31 and the ground line 32 for the circuit block B102 respectively, a route for a surge to pass through the protective transistors 28, 10, and 27 is secured even if the surge is applied between the power-source line 21 of the circuit block A101 and the ground line 32 for the circuit block B102 and moreover, a delay is provided so that a gate oxide film of the PMOS transistor 23 is not broken down before the surge completely flows through these three protective transistors and a surge voltage is not applied to a gate film from the signal line (protective resistor) 25. Thus, constituting a protective circuit by passing through two or three protective transistors is superior in that the transistors can be easily arranged.

As shown by the layout image diagram of the device chip in FIG. 14, because the power-source lines (terminals) 21 and 31 and ground lines (terminals) 22 and 32 for internal blocks intersects the power-source line (terminal) 11 and ground line (terminal) 12 for the input/output circuit at the circumferential portion of the chip with a vertical-height difference, it is possible to easily arrange protective transistors in the vicinity of the intersection. By arranging protective transistors on the intersecting portion, it is possible to easily constitute the protective-circuit network shown in FIG. 15 and protect the gate oxide film of a circuit for interfacing internal circuits each other from an electrostatic surge.

However, because the clock frequency of a device rises, the so-called salicide structure for minimizing the parasitic resistance of a transistor is introduced, an input/output-circuit region is divided into a plurality of subregions, and the total number of protective transistors (number of protective transistors passing from start to end points of an electrostatic surge) constituting a protective-circuit network increases. Therefore, the number of cases is increased in which it is impossible to prevent a gate (oxide film) from being broken down by only increasing the resistance value of the signal line (protective resistor) 25.

SUMMARY OF THE INVENTION

The present invention provides a compact electrostatic-breakdown-preventive and protective circuit for a semiconductor-device performing high-speed operations and capable of solving various problems to which the above-described improved protective-circuit network has become unable to respond, such as the problem of lowered the response characteristic of the protective-circuit network due to changes in process configuration and increases in the number of divided input/output-circuit regions, without increasing an area of the protective circuit or changing processes.

A first aspect of the invention provides an electrostatic-breakdown-preventive and protective circuit for a semiconductor-device, the circuit comprising: a first power-source line and a first ground line for supplying bias to a first internal block; a second power-source line and a second ground line for supplying bias to a second internal block; a third power-source line and a third ground line for supplying bias to an input/output circuit portion; at least one of a first protective transistor provided between the first power-source line and the second power-source line and a second protective transistor provided between the first ground line and the second ground line; third protective transistors respectively disposed at at least two of a position between the first power-source line and the third power-source line, a position between the first ground line and the third ground line, a position between the first power-source line and the third ground line, and a position between the first ground line and the third power-source line; fourth protective transistors disposed at at least two of a position between the second power-source line and the third power-source line, a position between the second ground line and the third ground line, a position between the second power-source line and the third ground line, and a position between the second ground line and the third power-source line; and a connection line for transferring an output signal of the first internal block as an input signal of the second internal block, wherein at least one of the first protective transistor and the second protective transistors is disposed in the vicinity of the connection line.

In the electrostatic-breakdown-preventive and protective circuit for a semiconductor-device of the first aspect, it is preferable that a distance in each of the first protective transistor and the second protective transistor from a contact hole for connecting an impurity diffusion layer serving as a source and a drain of the protective transistors with a metallic wiring, to a gate of the protective transistor is shorter than a distance in each of the third and fourth protective transistors from a contact hole for connecting an impurity diffusion layer serving as a source and a drain of the protective transistor with a metallic wiring, to a gate of the protective transistor.

In the electrostatic-breakdown-preventive and protective circuit for a semiconductor-device of the first aspect, it is allowed that at each of the first protective transistor and the second protective transistor, a compound layer of silicon and metal is formed on the entirety of a surface between a contact hole for connecting an impurity diffusion layer serving as a source and a drain with a metallic wiring, and a gate; and at each of the third and fourth protective transistors, a region, where no compound layer of silicon and metal is formed, is provided between a contact hole for connecting an impurity diffusion layer serving as a source and a drain with a metallic wiring, and a gate.

In the electrostatic-breakdown-preventive and protective circuit for a semiconductor-device of the first aspect, it is preferable that the distance in each of the first protective transistor and the second protective transistor from the contact hole for connecting the impurity diffusion layer serving as the source and the drain of the protective transistor with a metallic wiring, to the gate of the protective transistor has a minimum value possible in a fabrication process.

A second aspect of the invention provides an electrostatic-breakdown-preventive and protective circuit for a semiconductor-device, the circuit comprising: a first power-source line and a first ground line for supplying bias to a first internal block; a second power-source line and a second ground line for supplying bias to a second internal block; a third power-source line and a third ground line for supplying bias to an input/output circuit portion; first protective transistors respectively disposed at at least two of a position between the first power-source line and the third power-source line, a position between the first ground line and the third ground line, and a position between the first power-source line and the third ground line, a position between the first ground line and the third power-source line; second protective transistors respectively disposed at at least two of a position between the second power-source line and the third power-source line, a position between the second ground line and the third ground line, a position between the second power-source line and the third ground line, and a position between the second ground line and the third power-source line; a connection line for transferring an output signal of the first internal block as an input signal of the second internal block; and at least one of a first resistor whose one end is connected to the first power-source line and whose other end is connected to the second power-source line and a second resistor whose one end is connected to the first ground line and whose other end is connected to the second ground line, wherein at least one of the first resistor and the second resistor is disposed in the vicinity of the connection line.

As described above, the invention makes it possible to provide a compact electrostatic-breakdown-preventive and protective circuit for a semiconductor-device capable of performing high-speed operations.

DESCRIPTION OF THE PREFERRED EMBODIMENTS

Figure 1:
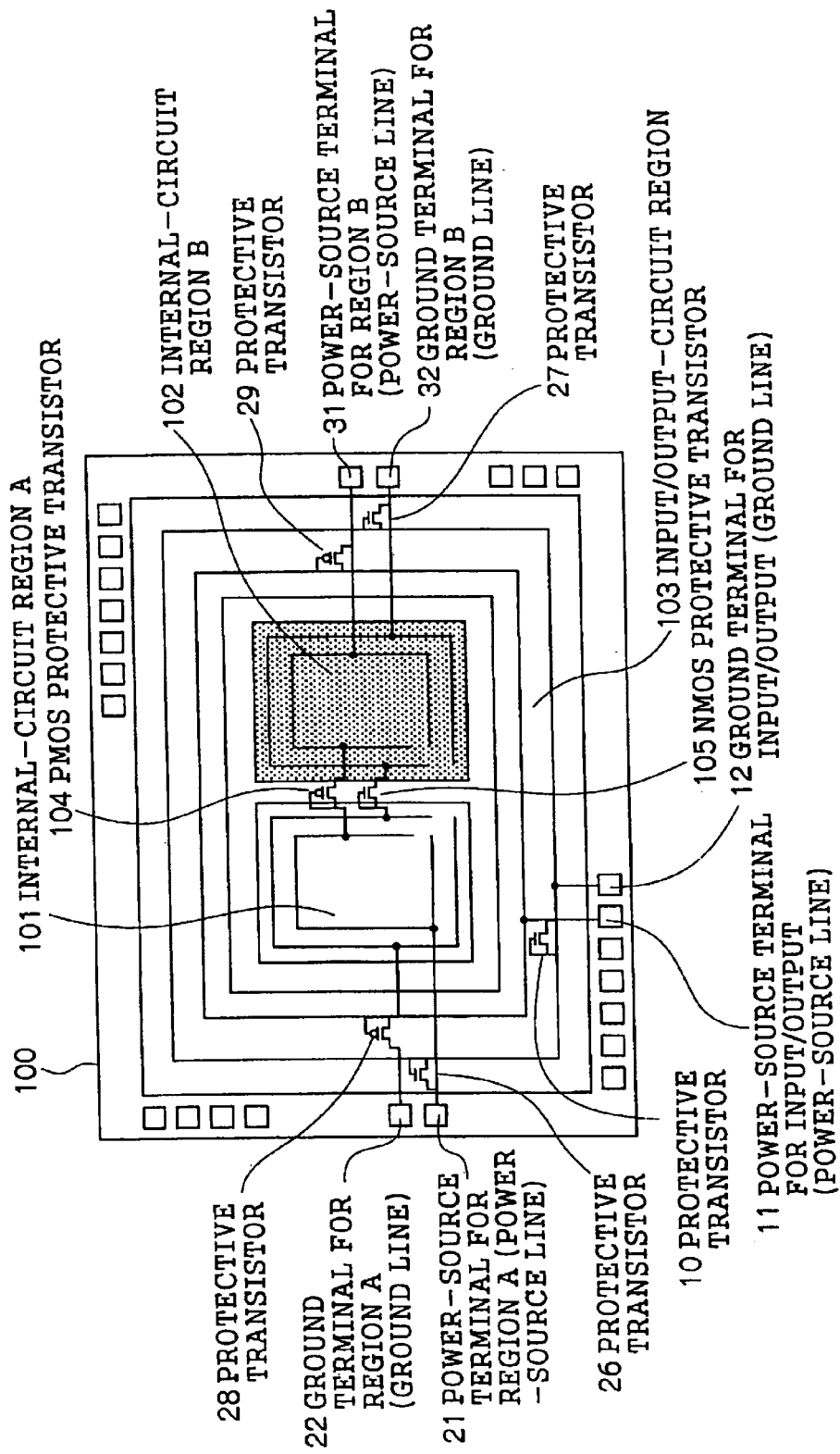
FIG. 1 is a layout image diagram on the device chip of an electrostatic-breakdown-preventive and protective circuit for a semiconductor-device of a first embodiment of the present invention.

Hereafter, embodiments of the present invention are described below by referring to the accompanying drawings. A component having substantially the same function is provided with the same reference numeral through all drawings and description thereof may be omitted.

(First Embodiment)

Figure 2:
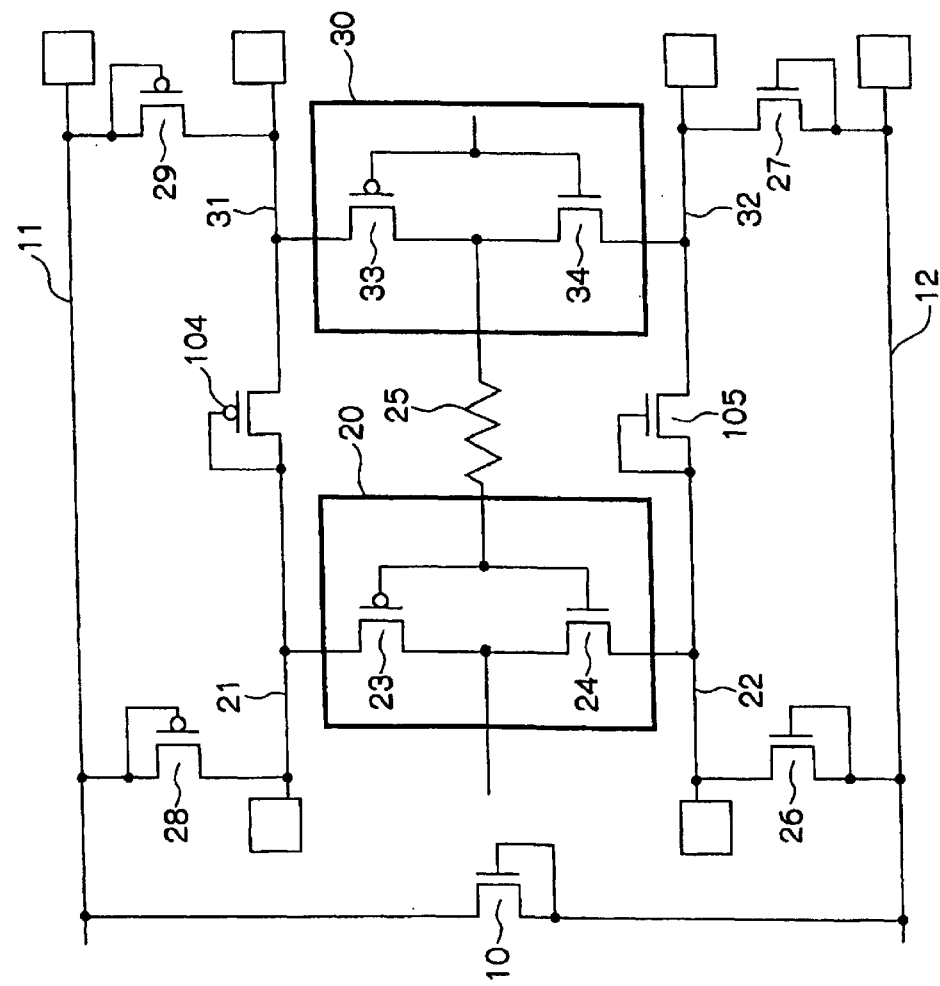
FIG. 2 is a circuit diagram of the electrostatic-breakdown-preventive and protective circuit for a semiconductor-device of the first embodiment.

FIG. 1 is a layout image diagram on the device chip of the electrostatic-breakdown-preventive and protective circuit for a semiconductor-device of the first embodiment. FIG. 2 is a circuit diagram of the electrostatic-breakdown-preventive and protective circuit for a semiconductor-device of the first embodiment.

As shown in FIGS. 1 and 2, the electrostatic-breakdown-preventive and protective circuit for a semiconductor-device of the first embodiment uses a semiconductor device 100 in which a circuit block A101 (internal-circuit region A) and a circuit block B102 (internal-circuit region B) have an equal supply potential but they have power-source systems independent from each other and the power-source system of an input/output circuit 103 (input/output circuit) is independent, and an inverter 20 connected to a circuit block A is constituted so as to receive an output of an inverter 30 connected to the circuit block B102 as an input signal through a signal line (protective resistor) 25.

The inverter 20 is constituted by a P-channel MOS (Metal Oxide Semiconductor which is hereafter referred to as PMOS) transistor 23 and an N-channel MOS (Metal Oxide Semiconductor which is hereafter referred to as NMOS) transistor 24, in which the source of the PMOS transistor 23 is connected to a power-source line 21 for a circuit block A101, the source of the NMOS transistor 24 is connected to a ground line 22 for a circuit block A101 and drains of the PMOS transistor 23 and an NMOS transistor 24 are shorted. The inverter 30 is constituted by a PMOS transistor 33 and the NMOS transistor 34, in which the source of the PMOS transistor 33 is connected to a power-source line 31 for the circuit block B102, the source of the NMOS transistor 34 is connected to a ground line 32 for the circuit block B102, and drains of the PMOS transistor 33 and NMOS transistor 34 are shorted. Gates of the PMOS transistor 23 and NMOS transistor 24 are connected with drains of the PMOS transistor 33 and NMOS transistor 34 through the protective resistor (signal line) 25.

A protective transistor 10 is provided between a power-source line 11 and a ground line 12 for the input/output circuit 103 and protective transistors 26, 27, 28, and 29 are provided between a power-source line 21 and ground line 22 for the circuit block A101 (region A), a position between a power-source line 31 and a ground line 32 for the circuit block B102 (region B), and a position between the power-source line 11 and the ground line 12 for the input/output circuit 103, respectively.

In a circuit having the above configuration, a PMOS protective transistor 104 is provided as a protective element between the power-source line 21 for the circuit block A101 and the power-source line 31 for the circuit block B102 and an NMOS protective transistor 105 is provided as a protective element between the ground line 22 for the circuit block A101 and the ground line 32 for the circuit block B102 in the internal-circuit region in the vicinity of the signal line (protective resistor) 25 for connecting the inverters 20 and 30 each other.

Operations when an electrostatic surge is applied between the power-source line 21 for the circuit block A101 and the ground line 32 for the circuit block B102 are described below. The electrostatic surge applied to the power-source line 21 for the circuit block A101 reaches the ground line 32 for the circuit block B102 from the PMOS transistor 23 and the NMOS transistor 24 of the inverter 20 through the NMOS protective transistor 105 and disappears or reaches the ground line 32 for the circuit block B102 from the PMOS protective transistor 104 through the PMOS 33 and NMOS 34 of the inverter 30 and disappears. Therefore, it is prevented that the gate (oxide film) of the PMOS transistor 23 of the inverter 20 is broken down. Also when an electrostatic surge is applied between a power-source line and a ground line of another combination, it is prevented that the gate (oxide film) of the PMOS transistor 23 or NMOS transistor 24 of the inverter 20 is broken down.

When neither the PMOS protective transistor 104 nor the NMOS protective transistor 105 is set, an electrostatic surge applied between the power-source line 21 for the circuit block A101 and the ground line 32 for the circuit block B102 circulates through the protective transistor 10 and the protective transistors 27 and 28 and thereby must circulate through the power-source line 11 or the ground line 12 for the input/output circuit 103 disposed around the chip. When the size of the chip is large and the power-source line 11 and the ground line 12 for the input/output circuit 103 are long or when a wiring width is narrow, a lot of time is required by the time the electrostatic surge completely circulates through the protective transistor 10 and the protective transistors 27 and 28. Therefore, there is a problem that a surge voltage is also applied to the gate (oxide film) of the PMOS transistor 23 or the NMOS transistor 24 of the inverter 20 and resultantly the gate (oxide film) is broken down. Therefore, a method of intentionally increasing a size of the signal line (protective resistor) 25 for connecting the inverters to each other is used so that no surge voltage is applied to the gate (oxide film) of the PMOS transistor 23 or the NMOS transistor 24 of the inverter 20.

In the first embodiment, the PMOS protective transistor 104 and the NMOS protective transistor 105 are set in the vicinity of the signal line (protective resistor) 25 for connecting inverters each other so as to circulate a surge current through these protective transistors and the inverters 20 and 30. Therefore, even if the response characteristic of a route passing through the protective transistor 10 and protective transistors 27 and 28 arranged on the input/output circuit 103 is deteriorated due to a chip size (length of the power-source line 11 or the ground line 12 for the input/output circuit 103) or a wiring width, the gate (oxide film) of the PMOS transistor 23 or the NMOS transistor 24 of the inverter 20 is securely prevented from being broken down without increasing the size of the signal line (protective resistor) 25.

If neither the PMOS protective transistor 104 nor the NMOS protective transistor 105 is set in the vicinity of the signal line (protective resistor) 25 for connecting the inverters to each other, wiring resistors $r_{21}$ and $r_{31}$ are added between the power-source line 21 or 31 and the PMOS protective transistor 104 and wiring resistors $r_{22}$ and $r_{32}$ are added between the ground line 22 or 23 and the NMOS protective transistor 105 and thereby, response characteristics of the PMOS protective transistor 104 and the NMOS protective transistor 105 to an electrostatic surge are deteriorated. Therefore, it is indispensable to set the PMOS protective transistor 104 and NMOS protective transistor 105 in the vicinity of the signal line (protective resistor) 25 for connecting inverters each other.

It is allowed that the PMOS protective transistor 104 and the NMOS protective transistor 105 respectively have a small area because it is enough that a surge voltage to be applied to an internal circuit can be transiently moderated by the time the surge current is completely circulated through the protective transistor 10 and protective transistors 27 and 28 arranged on the input/output circuit 103. Therefore, it is possible to ignore the disadvantage that the area of a protective circuit is increased by adding these protective transistors. Moreover, even if the PMOS protective transistor 104 or NMOS protective transistor 105 is broken down, it is not electrically deteriorated because the potential of the power-source line 21 for the circuit block A101 is equal to that of the power-source line 31 for the circuit block B102 and the potential of the ground line 22 for the circuit block A101 is equal to that of the ground line 32 for the circuit block B102. If there is an influence of breakdown of the transistors, a problem may occur that a malfunction margin decreases in one circuit block due to switching noises of the other circuit block. However, the influence is slight compared to the case in which the transistors are electrically deteriorated due to electrostatic breakdown.

(Second Embodiment)

Figure 3:
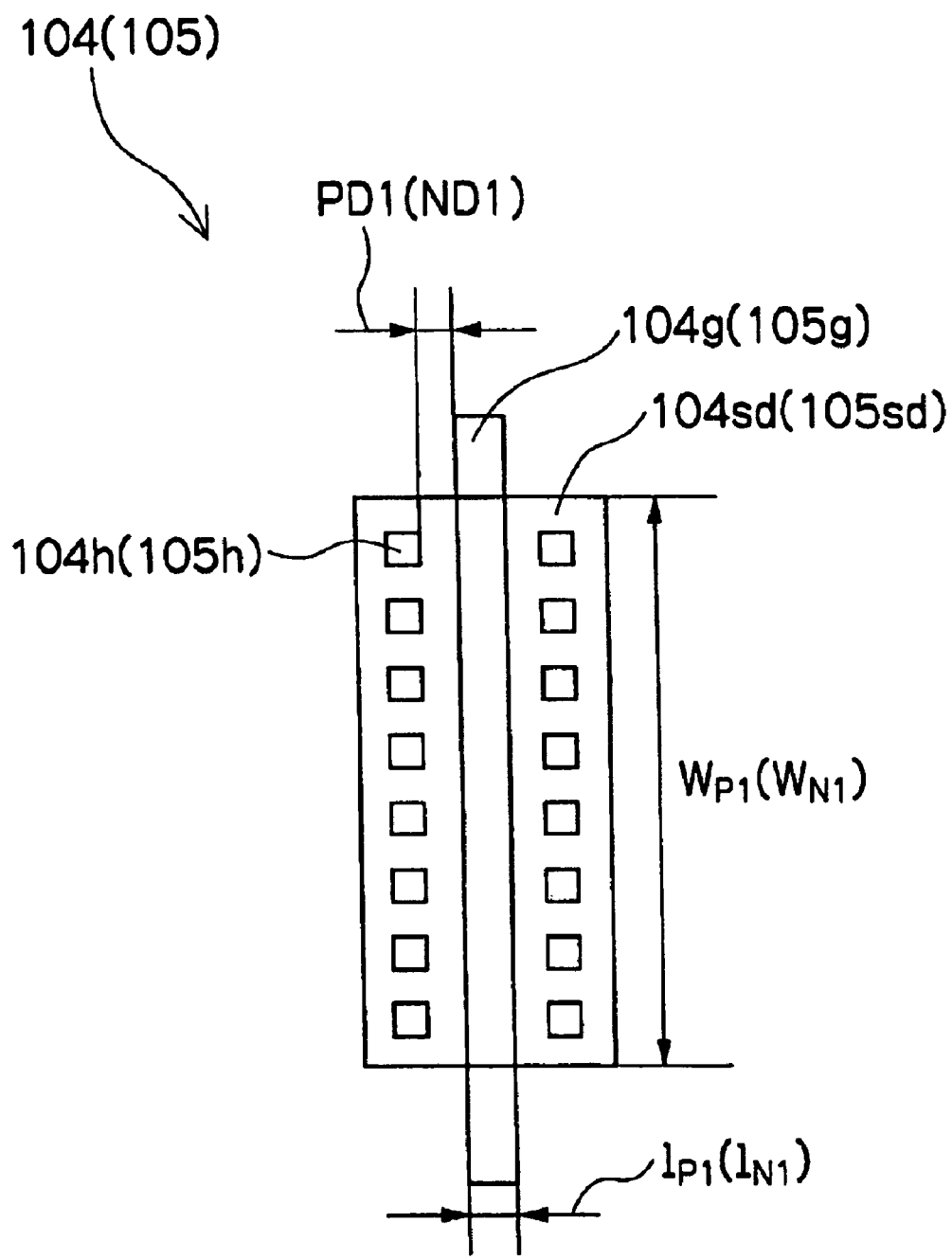
FIG. 3 is a top view showing a protective transistor of an electrostatic-breakdown-preventive and protective circuit for a semiconductor-device of a second embodiment of the present invention.
Figure 4:
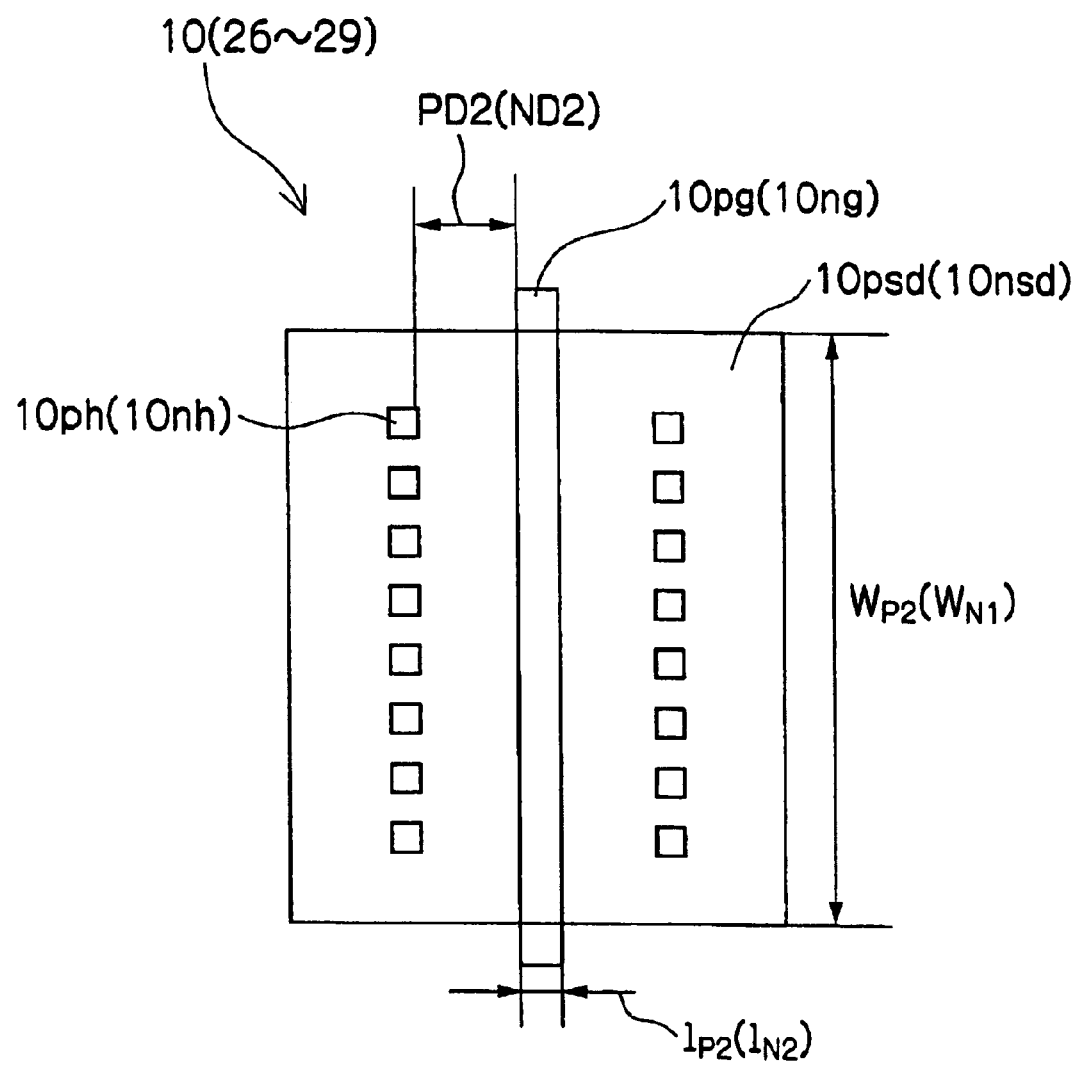
FIG. 4 is a top view showing another protective transistor of the electrostatic-breakdown-preventive and protective circuit for a semiconductor-device of the second embodiment.

FIG. 3 is a top view showing a protective transistor of the electrostatic-breakdown-preventive and protective circuit for a semiconductor-device of the second embodiment. FIG. 4 is a top view showing another protective transistor of the electrostatic-breakdown-preventive and protective circuit for a semiconductor-device of the second embodiment.

In the electrostatic-breakdown-preventive and protective circuit for a semiconductor-device of the second embodiment, description of portions common to those of the first embodiment is omitted. As shown in FIG. 3, the second embodiment uses the protective circuit of the first embodiment in which it is assumed that a distance from a contact hole (connection port) 104h for connecting an impurity diffusion layer 104sd serving as a source and a drain of the PMOS protective transistor 104 with a metallic wiring to a gate 104g is PD1 and a distance from a contact hole (connection port) 105h for connecting an impurity diffusion layer 105sd serving as a source and a drain of the NMOS protective transistor 105 with a metallic wiring to a gate 105g is ND1 in the protective circuit of the first embodiment. Moreover, as shown in FIG. 4, it is assumed that among the protective transistors 10 and 26 to 29, a distance from a contact hole (connection port) 10ph for connecting an impurity diffusion layer 10psd as a source and a drain of a PMOS transistor with a metallic wiring to a gate 10pg is PD2 and the distance from a contact hole (connection port) 10nh for connecting an impurity diffusion layer 10nsd as a source and a drain of an NMOS transistor with a metallic wiring to a gate long is ND2. In this case, each transistor is formed so as to satisfy relations of PD2>PD1 and ND2>ND1.

Particularly, to satisfy the above relations, it is preferable to set the distance from the contact hole (connection port) 104h (or 105h) for connecting the impurity diffusion layer 104sd (or 105sd) serving as the source and the drain of each of the PMOS protective transistor 104 and the NMOS protective transistor 105 with a metallic wiring to the gate 104g (or 105g) to a minimum value possible in a fabrication process.

In this case, the minimum value in the fabrication process represents the minimum value capable of forming a gate (electrode) and a contact hole separately from each other, which is decided in accordance with dimensional differences (mask conversion differences) between the alignment margin of a gate(electrode)—forming mask and a contact-hole-forming mask, patterns drawn on the masks, and patterns actually transferred onto and actually formed on a silicon wafer. This value depends on a fabrication process and it can be decreased for a process having a smaller (finer) working dimension.

Moreover, it is preferable to form each transistor so as to satisfy $\{W_{P1}/(l_{P1}+2\times PD1)\}>\{W_{P2}/(l_{P2}+2\times PD2)\}$ and $\{W_{N1}/(l_{N1}+2\times ND1)\}>\{W_{N2}/(l_{N2}+2\times ND2)\}$ when assuming the width of the gate 104g of the PMOS protective transistor 104 as $l_{P1}$, the length (length along gate) of the region of the impurity diffusion layer 104sd serving as a source and drain as $W_{P1}$, the width of the gate 105g of the NMOS protective transistor 105 as $l_{N1}$, and the length (length along gate) of the region of the impurity diffusion layer 105sd serving as a source and a drain as $W_{N1}$ as shown in FIG. 3, and assuming the width of the gate 10pg of a PMOS transistor among the protective transistors 10 and 26 to 29 as $l_{P2}$, the length (length along gate) of the region of the impurity diffusion layer 10psd serving as a source and a drain as $W_{P2}$, the width of the gate 10ng of an NMOS transistor as $l^{N2}$, and the length (length along gate) of the region of the impurity diffusion layer 10nsd serving as a source and drain as $W_{N2}$.

In this case, when assuming flowabilities of surge currents of the PMOS protective transistors 104 and 28 (29 is represented by 28) as $r_{104}$ and $r_{28}$ and flowabilities of surge currents of the NMOS protective transistors 105 and 26 (27 is represented by 26) as $r_{105}$ and $r_{26}$, relations between $r_{104}$, $r_{28}$, $r_{105}$, and $r_{26}$ and response characteristics to surge currents are described below.

Figure 5:
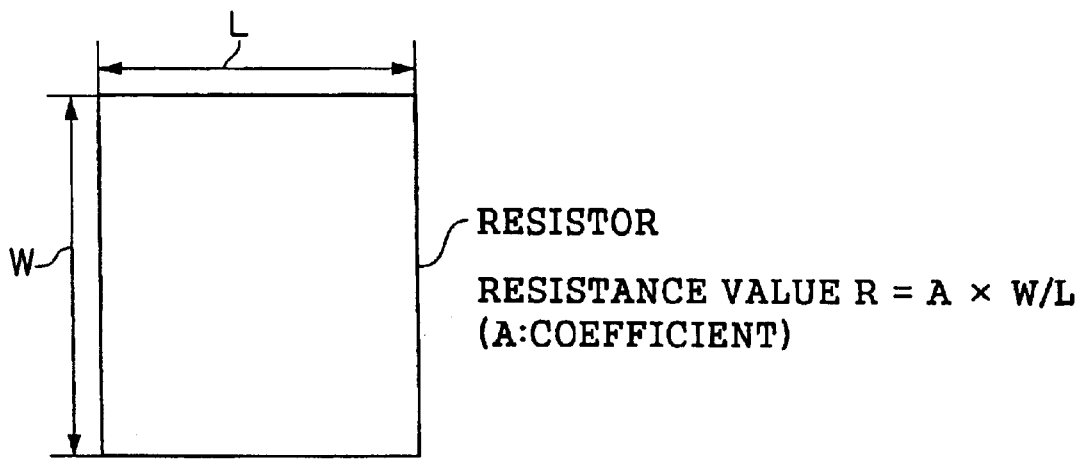
FIG. 5 is a schematic view for explaining the relationship between resistance width W and resistance length L at a resistance value R of a resistor.

As shown in FIG. 5, a resistance value R of a resistor is generally shown by an expression R=A×(W/L) (A denotes a coefficient), which is proportional to a resistance width W and inversely proportional to a resistance length L. Also when the PMOS protective transistors 104 and 28 and the NMOS protective transistors 105 and 26 respectively flow an electrostatic surge, each of them acts as a resistance. When handling a protective transistor as a resistance, $W_{P1}$, $W_{P2}$, $W_{N1}$, and $W_{N2}$ in FIGS. 3 and 4 correspond to the resistance width W and ($l_{P1}+2\times ND2$ PD1), ($l_{P2}+2\times PD2$), ($l_{N1}+2\times ND1$), and ($l_{N2}+2\times ND2$) in FIGS. 3 and 4 correspond to the resistance length L. Therefore, it is possible to express the flowability of an electrostatic surge of the PMOS protective transistor 104 as $r_{104}=W_{P1}/(l_{P1}+2\times PD1)$ and hereafter similarly $r_{28}=W_{P2}/(l_{P2}+2\times PD2)$, $r_{105}=W_{N1}/(l_{N1}+2\times ND1)$, and $r_{26}=W_{N2}/(l_{N2}+2\times ND2)$.

Then, the flowability of an electrostatic surge when replacing a protective transistor with a resistance, that is, the relationship between response characteristic to electrostatic surge and resistance value is described below.

Figure 6:
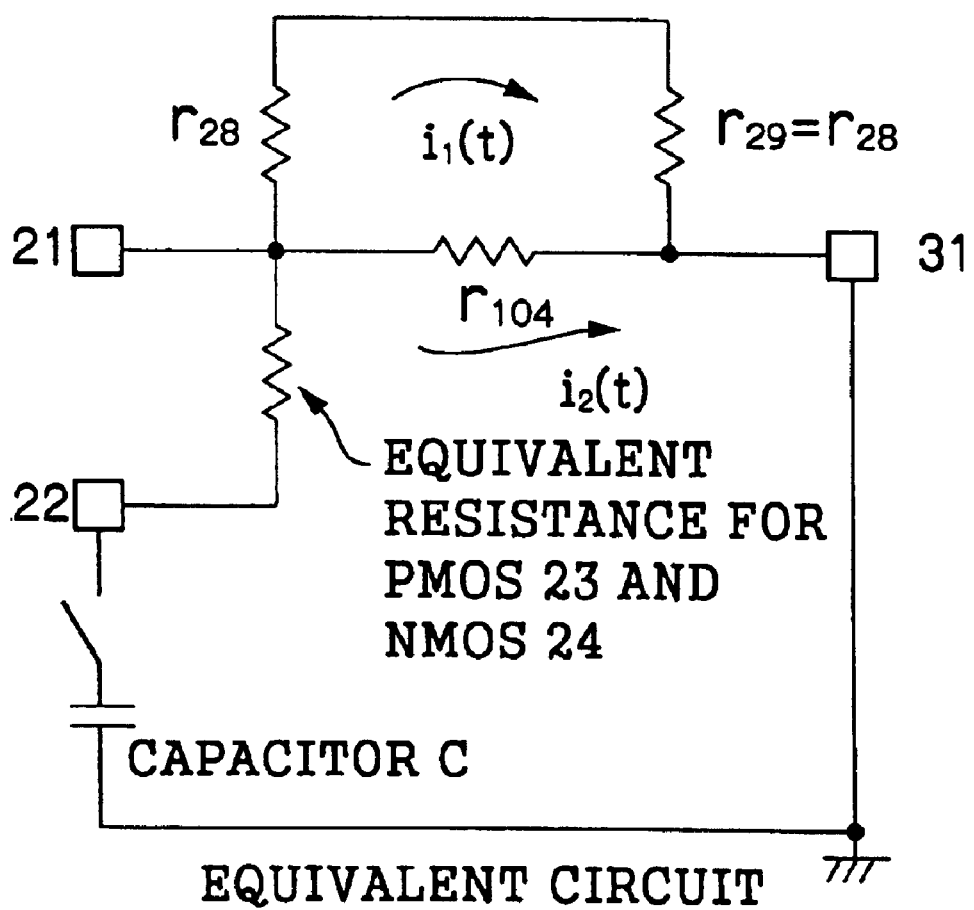
FIG. 6 is a circuit diagram showing an equivalent circuit obtained by replacing a PMOS protective transistor of the electrostatic-breakdown-preventive and protective circuit shown in FIG. 2 with a resistor and using discharge from a charged capacitor as an electrostatic surge.

FIG. 6 shows an equivalent circuit obtained by replacing the PMOS protective transistors 104 and 28 of the electrostatic-breakdown-preventive and protective circuit shown in FIG. 2 with resistances $r_{104}$ and $r_{28}$ and using an electrostatic surge as the discharge from a capacitor C charged to a voltage $V_0$. The current flowing through a circuit after closing a switch is expressed as a function of time. To simplify the description, equivalent resistances of the PMOS transistor 23 (expressed as PMOS 23 in FIG. 6) and NMOS transistor 24 (expressed as NMOS 24 in FIG. 6) are set to 0Ω (there is no problem because the influence on $i_1$ and $i_2$ is the same).

In the relationship between current flowing through circuit and time, when assuming the current flowing through $P_{MOS}$ transistors 28 and 29 as $i_1$ and the current flowing through the $P_{MOS}$ transistor 104 as $i_2$, the current value when assuming that each current flows through only one side is expressed by the following expression (1, a) by assuming $r_{28}=r_{29}=R$.

$$i_1(t) = \frac{V_0}{2R}\exp\left[-\frac{t}{2RC}\right] \quad (1, a)$$

For simplification, when assuming $r_{104}$ as R, the expression (1,a) is shown by the following expression (1,b).

$$i_2(t) = \frac{V_0}{R}\exp\left[-\frac{t}{RC}\right] \quad (1, b)$$

Figure 7:
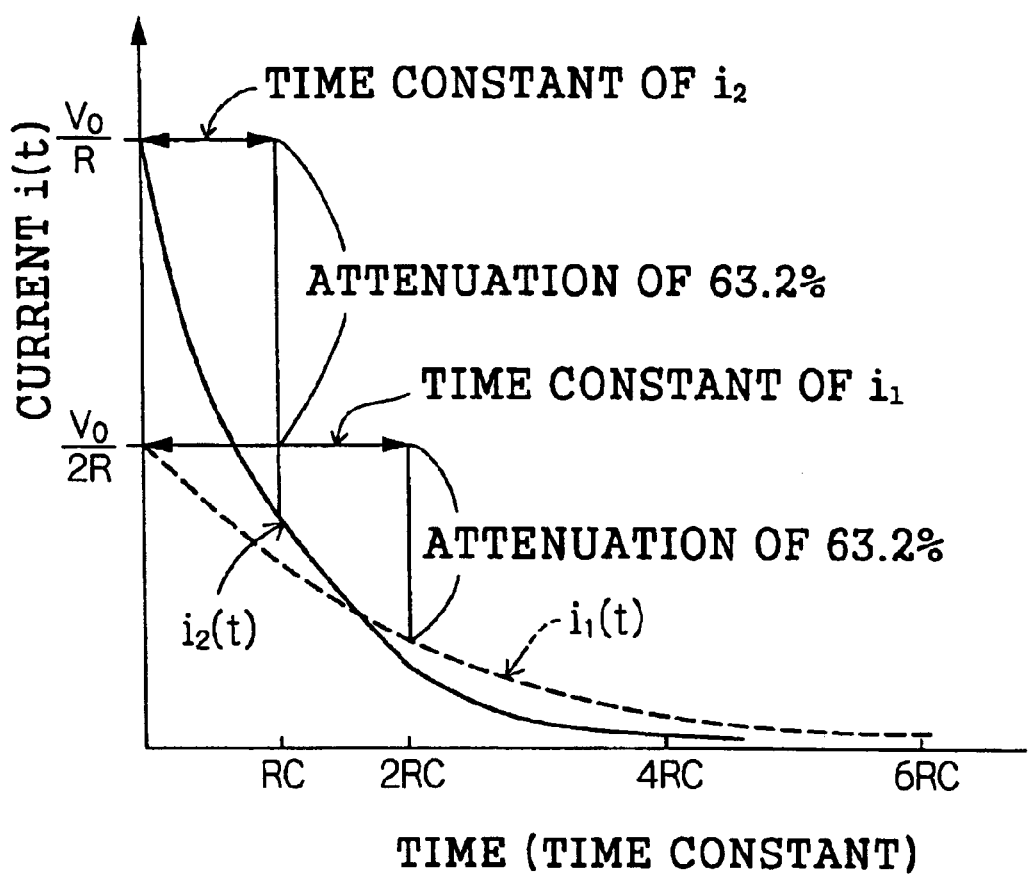
FIG. 7 is a graph showing the relationship between current $i_1(t)$ and current $i_2(t)$ circulating through the equivalent circuit in FIG. 6 and time.

FIG. 7 is a graph showing the relationship between currents flowing through two routes (independently-flowing current) and time assigned to the abscissa.

Though the initial current value of $i_2$ is two times larger than that of $i_1$, the subsequent attenuation time is short. This shows that the time for a surge current to flow through a circuit decreases, that is, the response characteristic to a surge is improved by decreasing $r_{105}$. Because decrease of the distance between a gate and a contact hole corresponds to decrease of (2×PD1) and (2×ND1), $r_{104}$ and $r_{105}$ are lowered.

The fact that the initial current of $i_2$ flows two times larger than that of $i_1$ represents being exposed to a sudden surge current and therefore, a protective transistor is easily broken down. However, by properly increasing a resistance, it is possible to reduce an initial value and prevent a protective transistor from being easily broken down (however, response characteristic is deteriorated).

Thus, by providing a proper resistance for the PMOS protective transistors 28 and 29, and NMOS protective transistors 26 and 27 which are required to have resistance characteristics and giving priority to the response characteristic to a surge, it is possible to minimize resistances of the PMOS protective transistor 104 and NMOS protective transistor 105.

The mathematical equation that expresses the above-described relationship is $(W_{P1}/l_{P1}+2\times PD1)>(W_{P2}/l_{P2}+2\times PD2)$ and $(W_{N1}/l_{N1}+2\times ND1)>(W_{N2}/l_{N2}+2\times ND2)$.

Thus, the response characteristic of a protective transistor is improved by decreasing the distance between a gate and a contact hole but the transistor is easily broken down because a surge current suddenly flows. However, when increasing the distance between the gate and contact hole, the response characteristic to an electrostatic surge is deteriorated though a surge current can be properly restricted. Particularly, when using the minimum value of a fabrication process for the distance, the response characteristic is maximized.

When using the minimum value of a fabrication process for the distance between the gate and the contact hole of each of the protective transistors 10 and 26 to 29, a surge current suddenly flows as described above and thereby a transistor is broken down. However, when increasing the distance between the gate and the contact hole, the response characteristic to an electrostatic surge is deteriorated though a surge current can be properly restricted. The fact that the distance between the gate and contact hole of each of the protective transistors 10 and 26 to 29 must be increased causes the response characteristic of a route passing through the protective transistors 10 and 27 arranged on the input/output circuit 103 to deteriorate (to inevitably deteriorate).

Therefore, in the case of protective circuits of the second embodiment, the distance from the contact hole (connection port) 104h (or 105h) of the PMOS protective transistor 104 and the NMOS protective transistor 105 to the gate 104g (or 105g) is made smaller than the distance from the contact hole (connection port) 10ph (or 10nh) of each of the protective transistors 10 and 26 to 29 to the gate 10pg (or 10ng). That is, in each of the PMOS protective transistors 10 and 26 to 29 inevitably using a transistor having a bad response characteristic, the distance between a gate and contact hole is increased in order to secure the breakdown resistance of its own. In each of the PMOS protective transistor 104 and NMOS protective transistor 105, the distance between a gate and contact hole is decreased in order to improve the response characteristic (particularly, it is preferable to use the minimum value of a process for the distance and maximized the response characteristic). Even when an electrostatic surge is applied between the power-source line 21 for the circuit block A101 and the ground line 32 for the circuit block B102, the response characteristic of a route for supplying a surge current to the inverters 20 and 30 is improved while providing the breakdown resistance for protective transistors by improving breakdown resistances of the PMOS protective transistor 10 and protective transistors 27 and 28 and improving the response characteristic of the PMOS protective transistor 104, a surge voltage to be applied to the signal line (protective resistor) 25 for preventing the surge voltage from being applied to the gate of each transistor of the inverter 20 by the time an electrostatic surge completely flows, and it is more effectively prevented that gates of the inverters 20 and 30 are broken down. Moreover, even when an electrostatic surge is applied between each power-source line and ground line in accordance with another combination, it is prevented that the gate (oxide film) of each transistor of the inverters 20 and 30 is broken down by improving breakdown resistances of the protective transistors 10 and 26 to 29 and response characteristics of the PMOS protective transistor 104 and the NMOS protective transistor 105.

Because the operation of a protective transistor to an electrostatic surge is the same as the case of the first embodiment, description of the operation is omitted.

As described above, in the case of each of the PMOS protective transistor 104 and the NMOS protective transistor 105, by decreasing the distance from a contact hole (connection port) up to a gate and improving the response characteristic compared to the case of each of the protective transistors 10 and 26 to 29 and particularly using the minimum value of a fabrication process for the distance and thereby maximizing the response characteristic, the gate of each transistor of the inverter 20 is prevented from being broken down while preventing the resistance value of the protective resistor (signal line) 25 from being increased (particularly, it is possible to decrease the resistance value of the protective resistor (signal line) 25 more than in the case of the first embodiment). Moreover, because the distance between the gate and the contact hole in each of the PMOS protective transistor 104 and the NMOS protective transistor 105 is decreased (particularly, minimum value of fabrication process is used), it is possible to decrease the area of a protective transistor and further ignore the increment of the protective transistor area.

Similarly to the case of the first embodiment, even if both the PMOS protective transistor 104 and the NMOS protective transistor 105 are broken down, they do not become electrically defective. Even if there is an influence, only a malfunction margin is decreased in one circuit block due to switching noises of the other circuit block and the influence is small compared to the case in which they become electrically defective due to electrostatic breakdown.

(Third Embodiment)

Figure 8:
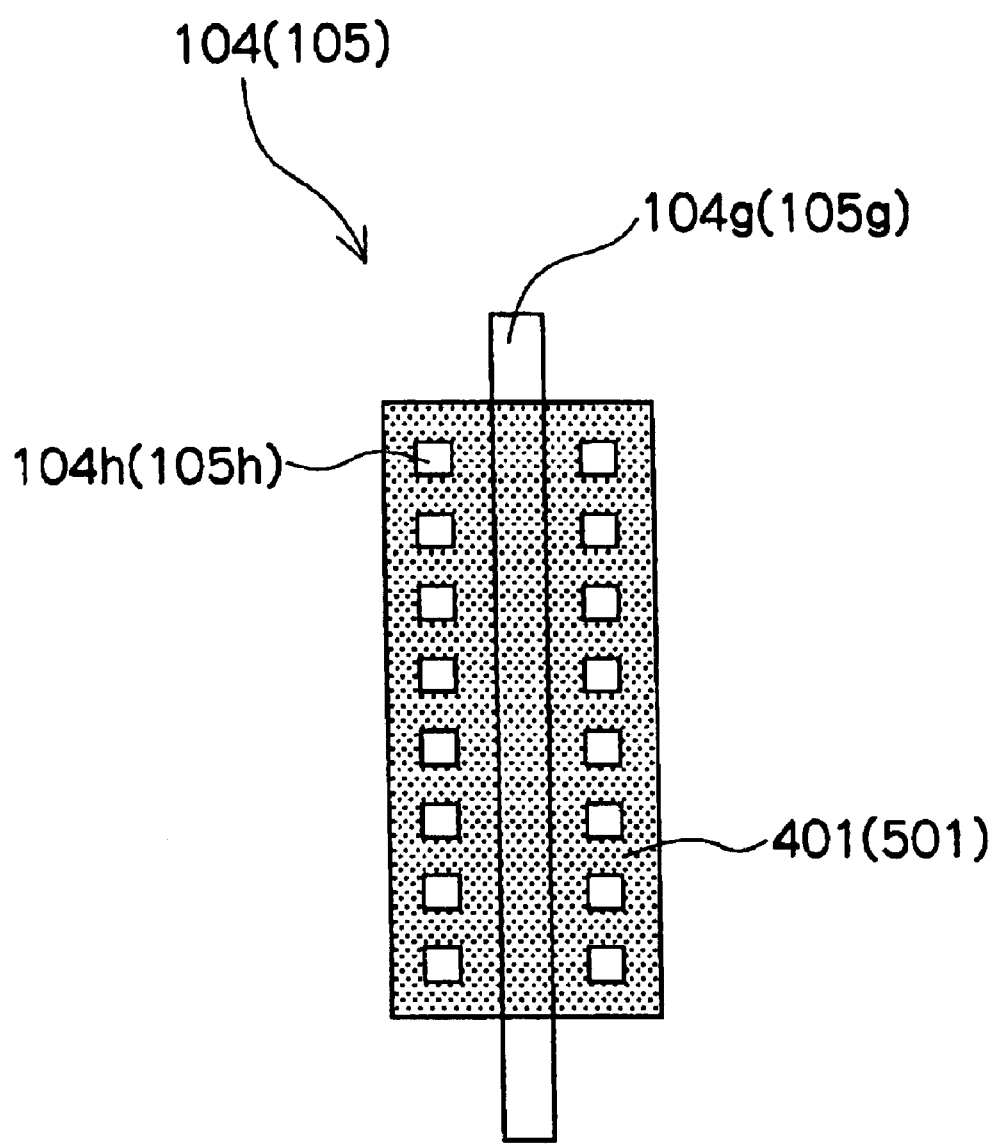
FIG. 8 is a top view showing a protective transistor of an electrostatic-breakdown-preventive and protective circuit for a semiconductor-device of a third embodiment of the present invention.
Figure 9:
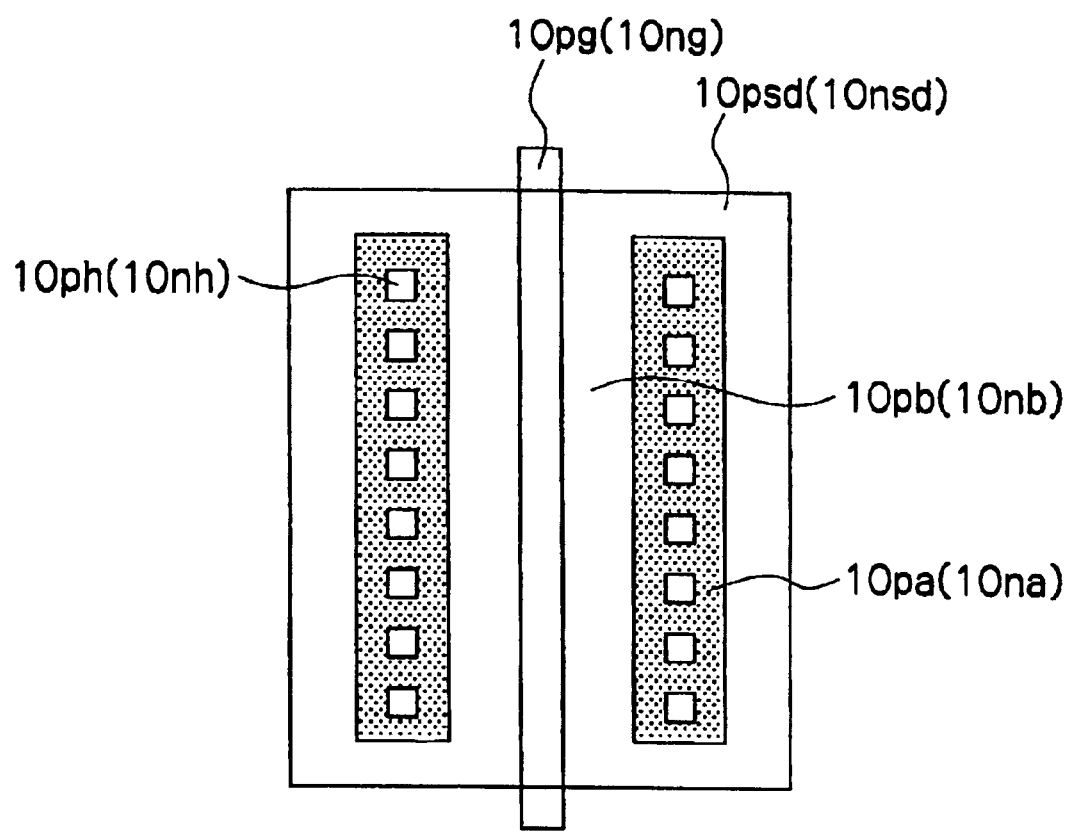
FIG. 9 is top view showing another protective transistor of the electrostatic-breakdown-preventive and protective circuit for a semiconductor-device of the third embodiment.

FIG. 8 is a top view showing a protective transistor of the electrostatic-breakdown-preventive and protective circuit for a semiconductor-device of the third embodiment. FIG. 9 is a top view showing another protective transistor of the electrostatic-breakdown-preventive and protective circuit for a semiconductor-device of the third embodiment.

In the electrostatic-breakdown-preventive and protective circuit for a semiconductor-device of the third embodiment, description of a portion common to that of the first embodiment is omitted. The third embodiment uses transistors respectively using the so-called salicide structure for forming a compound layer of silicon and metal (hereafter referred to as salicide layer) on the surface of an impurity diffusion layer in order to decrease the parasitic resistance of the impurity diffusion layer.

As shown in FIG. 9, the protective circuit of the third embodiment uses the protective circuit of the first embodiment in which a salicide layer 10pa is formed in the vicinity of the contact hole 10ph on the impurity diffusion layer 10psd serving as a source and a drain in the PMOS protective transistor among the protective transistors 10 and 26 to 29 and a no-salicide-layer-forming region 10pb in which the salicide layer 10pa is not formed (that is, remaining as a P-type impurity diffusion layer) is formed between the gate 10pg and the contact hole 10ph, and a salicide layer 401 is formed on the entire surface between the gate 104g and the contact hole 104h on the impurity diffusion layer 104sd (not illustrated in FIG. 8) serving as a source and a drain of the PMOS protective transistor 104 as shown in FIG. 8. Moreover, as shown in FIG. 9, a salicide layer 10na is formed in the vicinity of the contact hole 10nh on the impurity diffusion layer 10nsd serving as a source and a drain of the NMOS protective transistor among protective transistors 10 and 26 to 29 and a no-salicide-layer-forming region 10nb in which the salicide layer 10na is not formed (that is, remaining as an N-type impurity diffusion layer) is formed between the gate 10ng and the contact hole 10nh and a salicide layer 501 is formed on the entire surface between the gate 105g and contact hole 105h on the impurity diffusion layer 105sd (not illustrated in FIG. 8) serving as a source and drain of NMOS protective transistor 105 as shown in FIG. 8.

In general, when a salicide layer is formed on the entire surface between a gate and a contact hole on an impurity diffusion layer serving as a source and a drain, the response characteristic is improved even though a transistor becomes likely to be broken down if a surge current suddenly flows. However, when a region remaining as an impurity diffusion layer if formed (a region where no salicide layer is formed) between a gate and contact hole, the electrostatic-breakdown resistance of a transistor is improved because a surge current can be properly restricted, but the response characteristic to an electrostatic surge is deteriorated.

Therefore, forming a region remaining as an impurity diffusion layer between a gate and a contact hole on each of the PMOS protective transistors 10 and 26 to 29 causes the response characteristic of a route passing through the protective transistor 10 and protective transistors 27 and 28 arranged on the input/output circuit 103 to deteriorate (inevitably deteriorate).

Therefore, in each of the PMOS protective transistors 10 and 26 to 29 inevitably using a transistor having a bad response characteristic among protective circuits of the third embodiment, a region (no-salicide-layer-forming region) remaining as an impurity diffusion layer is formed between a gate and a contact hole in order to secure the breakdown resistance of itself and in each of the PMOS protective transistor 104 and the NMOS protective transistor 105, a salicide layer is formed on the entire surface between a gate and a contact hole on an impurity diffusion layer serving as a source and a drain in order to improve the response characteristic. Similarly to the case of the second embodiment, even when an electrostatic surge is applied between the power-source line 21 for the circuit block A101 and the ground line 32 for the circuit block B102, the breakdown of the gate of the inverter 20 is more-efficiently prevented by improving breakdown resistances of the protective transistor 10 and protective transistors 27 and 28 and the response characteristic of the PMOS protective transistor 104. Moreover, similarly, even when an electrostatic surge is applied between each power-source line and ground line in accordance with another combination, breakdown of the gate (oxide film) of the PMOS transistor 23 or the NMOS transistor 24 of the inverter 20 by improving breakdown resistances of the protective transistors 10 and 26 to 29 and response characteristics of the PMOS protective transistor 104 and NMOS protective transistor 105.

Because the operation of a protective circuit to an electrostatic surge is the same as that of the first embodiment, description of the operation is omitted.

As described above, in the case of the PMOS protective transistor 104 and NMOS protective transistor 105, the response characteristic of each protective transistor to an electrostatic surge is improved by forming a salicide layer on the entire surface between a gate and contact hole and in the case of each of the protective transistors 10 and 26 to 29, the breakdown resistance to an electrostatic surge is improved by forming a region remaining as an impurity diffusion layer (region where no salicide layer is formed) between a gate and a contact hole. Therefore, breakdown of the gate (oxide film) of each transistor of the inverters 20 and 30 is prevented while preventing the resistance value of the protective resistor (signal line) 25 from increasing (particularly, the resistance value of the protective resistor (signal line) 25 can be decreased more than in the case of the first embodiment). Moreover, in the case of the PMOS protective transistor 104 and NMOS protective transistor 105, because a region remaining as an impurity diffusion layer is not formed between a gate and contact hole, it is possible to decrease a protective transistor area and further ignore the increment of the protective transistor area.

Even if both the PMOS protective transistor 104 and NMOS protective transistor 105 are broken down, they do not become electrically defective. If there is an influence, a malfunction margin is decreased at most in one circuit block due to switching noises of the other circuit block and the influence is small compared to the case in which they become electrically defective due to electrostatic breakdown.

(Fourth Embodiment)

Figure 10:
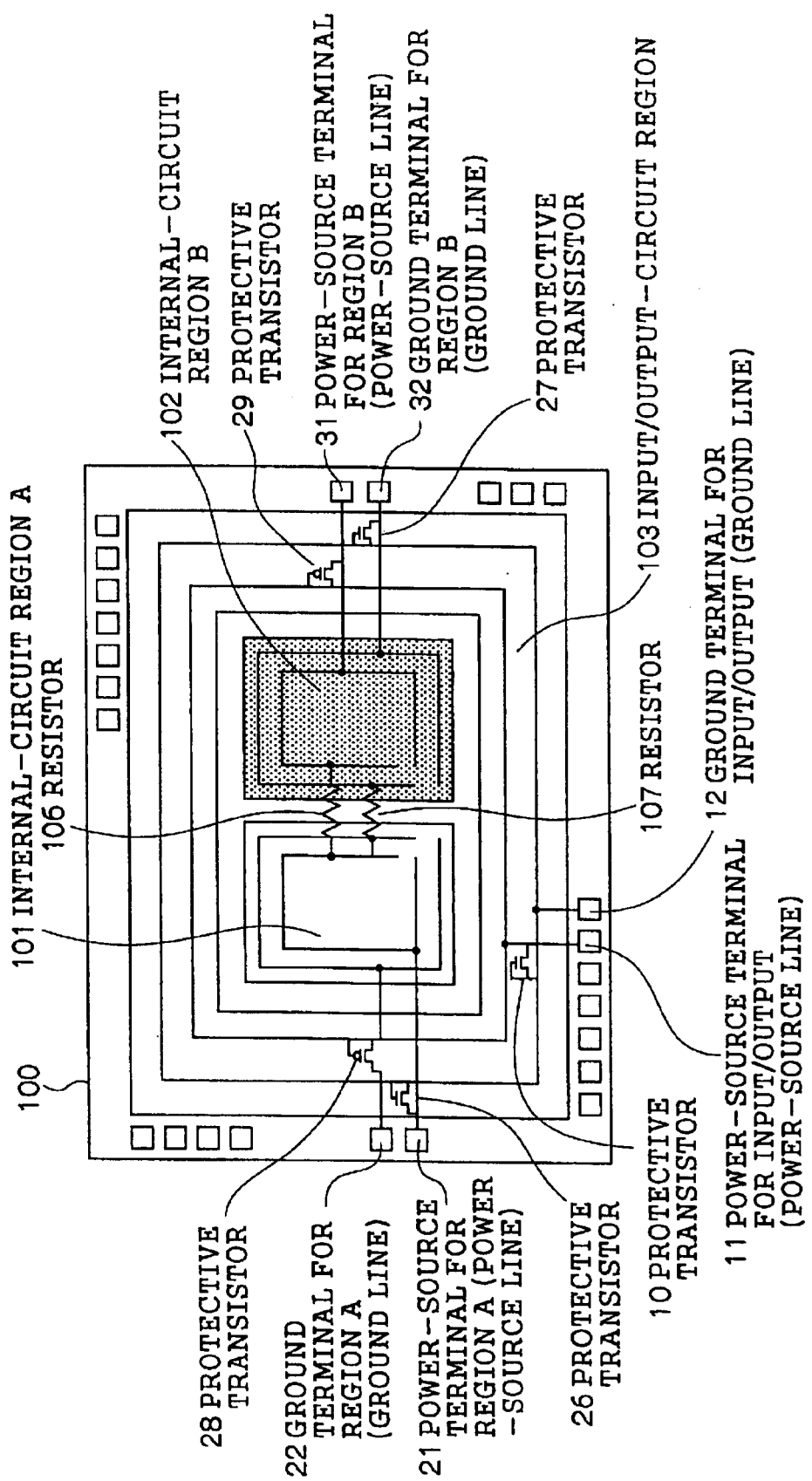
FIG. 10 is a layout image diagram on the device chip of an electrostatic-breakdown-preventive and protective circuit for a semiconductor-device of a fourth embodiment of the present invention.
Figure 11:
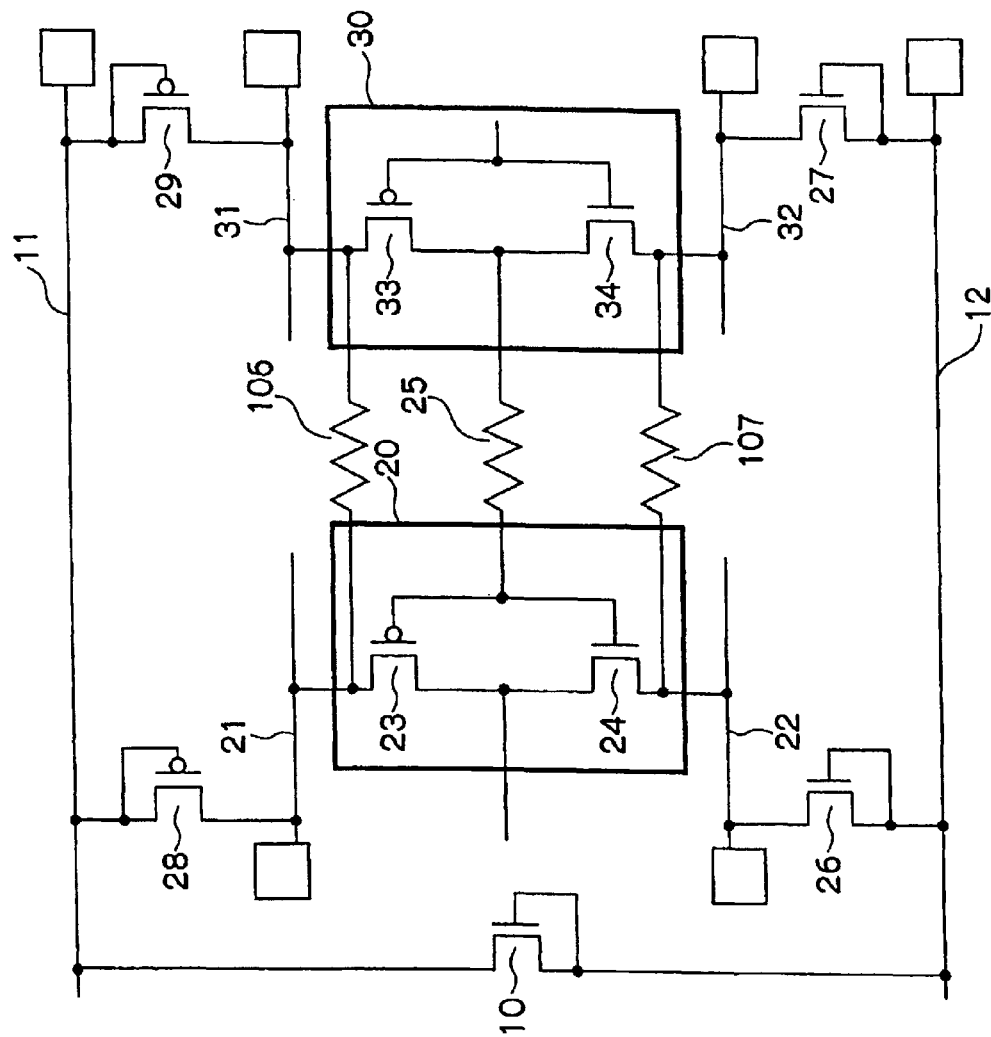
FIG. 11 is a circuit diagram of the electrostatic-breakdown-preventive and protective circuit for a semiconductor-device of the fourth embodiment.
Figure 12:
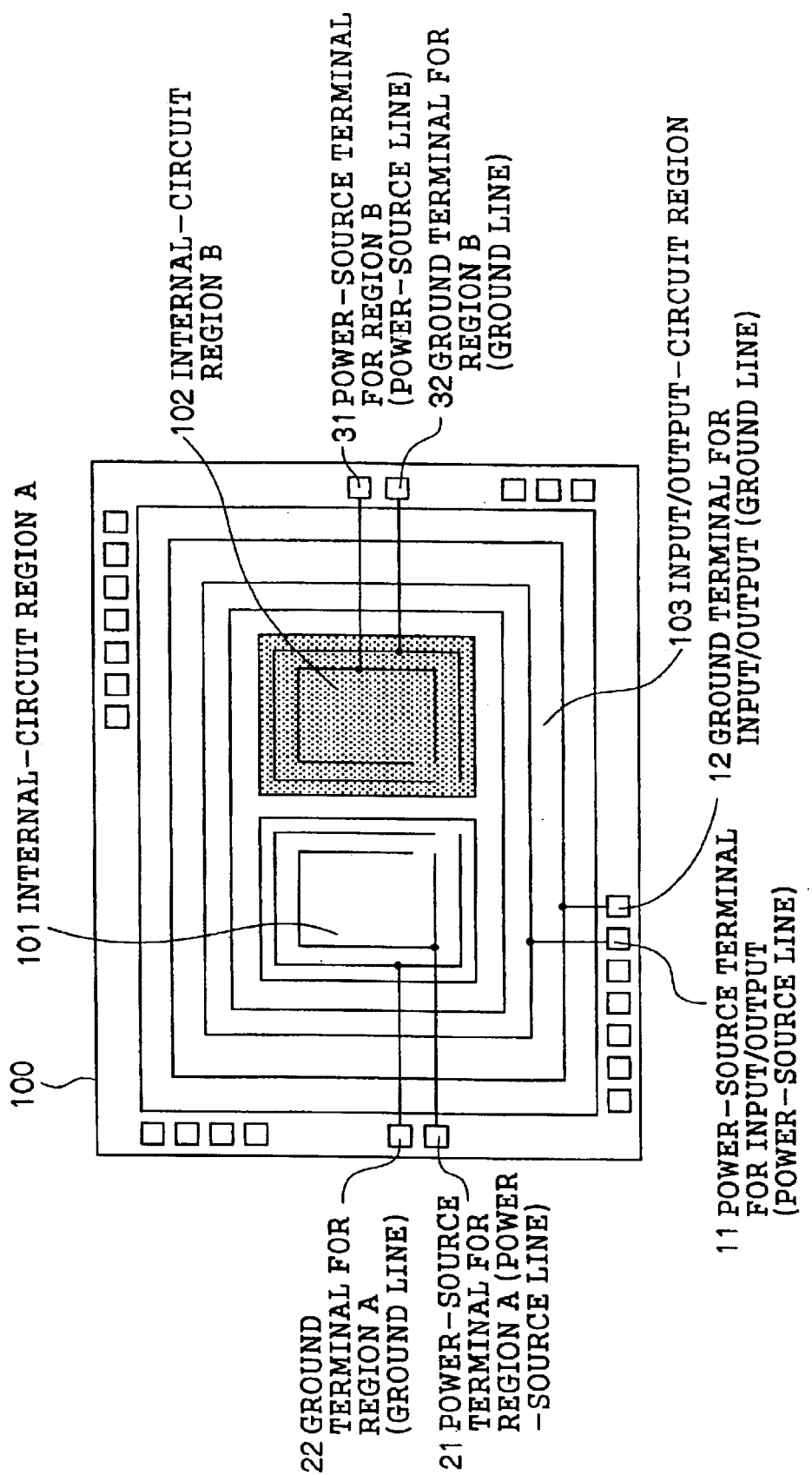
FIG. 12 is a layout image diagram on a device chip of a conventional semiconductor-device electrostatic-breakdown-preventive and protective circuit.
Figure 13:
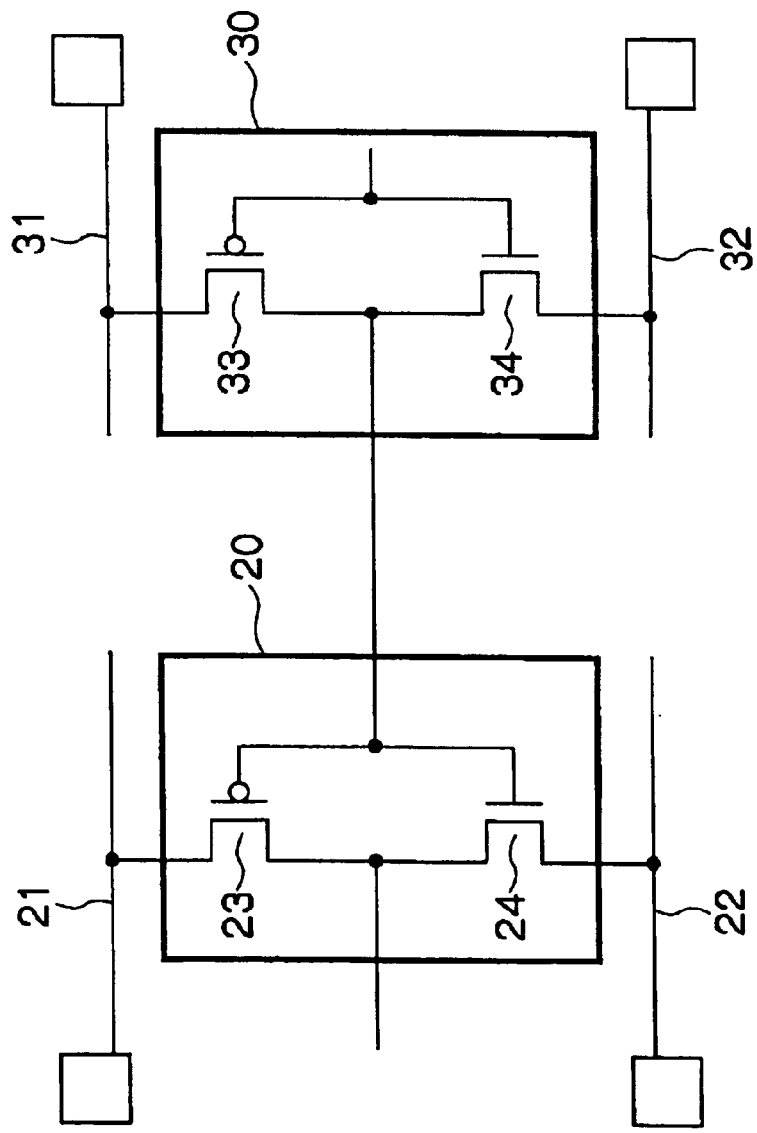
FIG. 13 is a circuit diagram of the conventional semiconductor-device electrostatic-breakdown-preventive and protective circuit.
Figure 14:
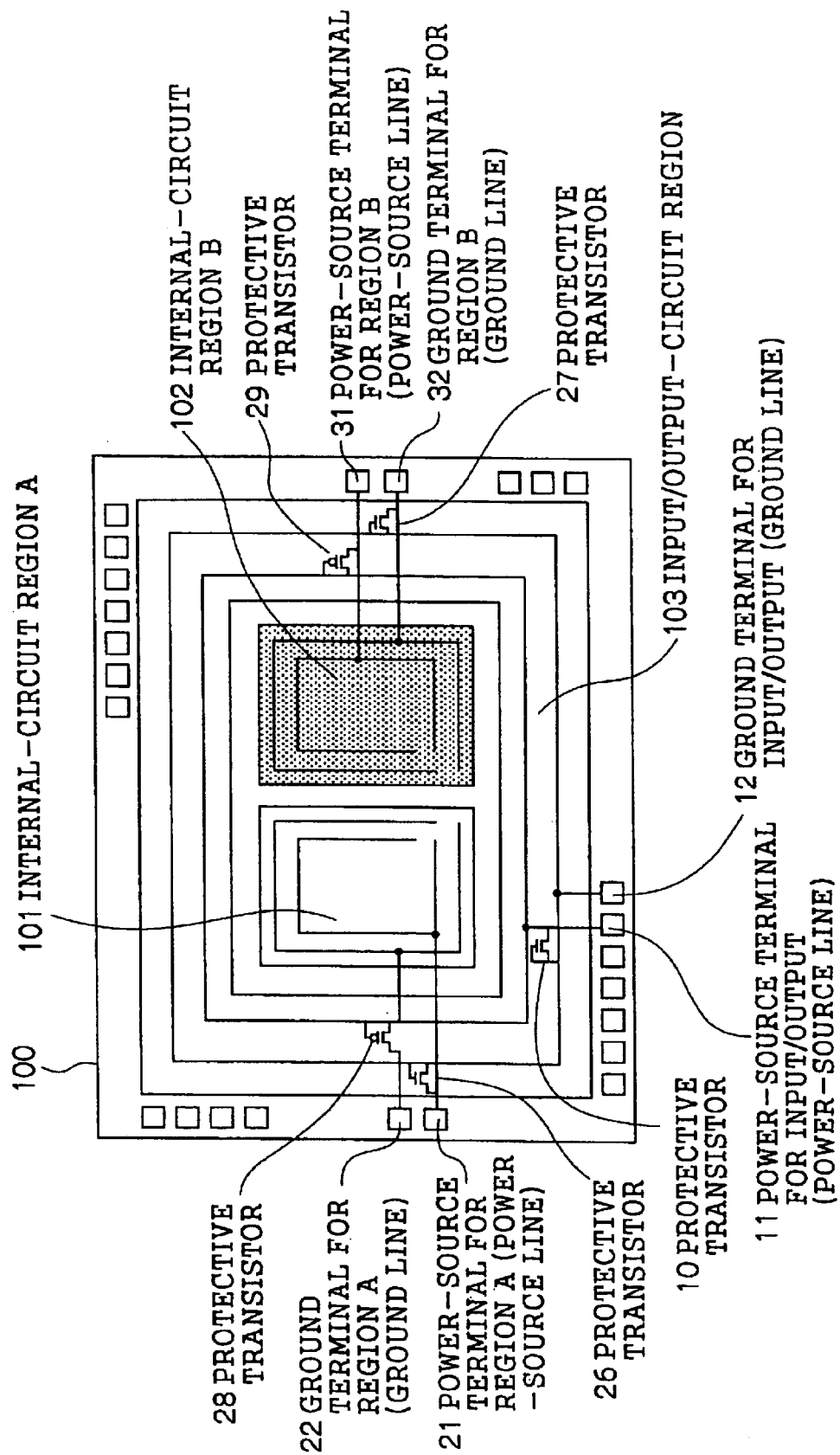
FIG. 14 is a layout image diagram on a device chip of a conventional improved semiconductor-device electrostatic-breakdown-preventive and protective circuit.
Figure 15:
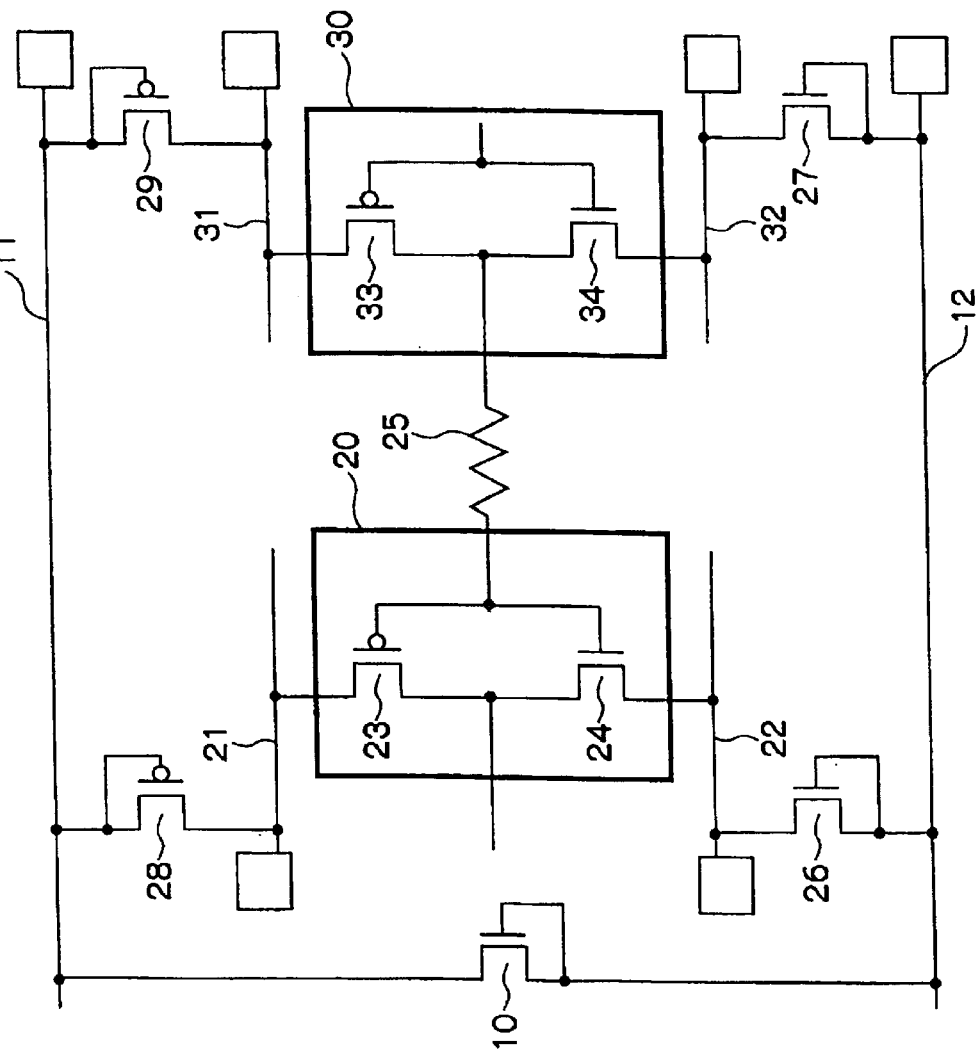
FIG. 15 is a circuit diagram of the conventional improved semiconductor-device electrostatic-breakdown-preventive and protective circuit.

FIG. 10 is a layout image diagram on a device chip of a electrostatic-breakdown-preventive and protective circuit for a semiconductor-device of a fourth embodiment. FIG. 11 is a circuit diagram of the electrostatic-breakdown-preventive and protective circuit for a semiconductor-device of the fourth embodiment.

In the electrostatic-breakdown-preventive and protective circuit for a semiconductor-device of the fourth embodiment, description of portions common to the first embodiment is omitted. As shown in FIGS. 10 and 11, in the case of the electrostatic-breakdown-preventive and protective circuit for a semiconductor-device of the fourth embodiment, neither the PMOS protective transistor 104 nor the NMOS protective transistor 105 of the first embodiment is formed but the vicinity of the connective portion between the source and power-source line 21 for the circuit block A of the PMOS transistor 23 of the inverter 20 and the vicinity of the connective portion between the source and power-source line 31 for the circuit block B102 of the PMOS transistor 33 of the inverter 30 are shorted through a resistor 106 serving as a protective element and the vicinity of the connective portion between the source and the ground line 22 for the circuit block A101 of the NMOS transistor 24 of the inverter 20 and the vicinity of the connective portion between the source and ground line 32 for the circuit block B102 of the NMOS transistor 34 of the inverter 30 are shorted through a resistor 107 serving as a protective element.

In the protective circuit of the fourth embodiment, the temporal delay up to the time the PMOS protective transistor 104 or the NMOS protective transistor 105 can flow a surge current is eliminated by replacing the PMOS protective transistor 104 and the NMOS protective transistor 105 of the first embodiment with the resistors 106 and 107 respectively. Moreover, when the PMOS protective transistor 104 or the NMOS protective transistor 105 supplies a surge current, one of the following states is necessary: (1) the PMOS (or NMOS) protective transistor causes a punch-through and (2) the below-gate is inverted and a channel is formed. In any case, it is indispensable that the below-gate (channel region) is depleted in accordance with an electric field from a drain or gate. However, because the above depletion requires a short time, the response characteristic to a surge current is further improved by forming a bypass with a pure resistor. Therefore, a surge voltage applied to the signal line (wiring resistor) 25 for preventing the surge voltage from being applied to the gate of each transistor of the inverter 20 is further lowered by the time an electrostatic surge is completely flown and thereby, it is possible to more effectively prevent the breakdown of the gate of each transistor of the inverter 20.

Setting the resistors 106 and 107 in the vicinity of the signal line (wiring resistor) 25 is described for the first embodiment the same as the case of the PMOS protective transistor 104 and the NMOS protective transistor 105.

As described above, by replacing the PMOS protective transistor 104 of the first embodiment with the resistor 106 and the NMOS protective transistor 105 with the resistor 107, it is possible to prevent the breakdown of the gate of each transistor of the inverter 20 while preventing the resistance value of the signal line (protective resistor) 25 from increasing. Because of only connecting the power-source line 21 for the internal block A with the power-source line 31 for the internal block B and the ground line 22 for the internal block A with the ground line 32 for the internal block B through resistances, it is possible to greatly reduce a pattern area.

Also in the present embodiment, it is considered that a malfunction margin is decreased in one circuit block due to switching noises of the other circuit block. However, the influence is small compared to the case in which they become electrically defective due to electrostatic breakdown. Moreover, it is possible to select an optimum resistance value capable of minimizing influences by switching noises while securing the electrostatic-breakdown resistance.

In the first to fourth embodiments, an interface circuit between CMOS inverters is described as an example. However, each of the first to fourth embodiments can be also applied to an interface circuit for receiving a signal output from a PMOS or NMOS output transistor as a gate input of the same type of transistor. Moreover, each of the embodiments can be applied to a case of receiving the signal as not a gate input but a transfer-gate(drain-input)-type input. Furthermore, it is possible to combine the first to third embodiments. Furthermore, each of the first to fourth embodiments can be applied to only the power-source-line side or to only the ground-line side.

What is claimed is:

1. An electrostatic-breakdown-preventive and protective circuit for a semiconductor-device, the circuit comprising:
    a first power-source line and a first ground line for supplying bias to a first internal block;
    a second power-source line and a second ground line for supplying bias to a second internal block;
    a third power-source line and a third ground line for supplying bias to an input/output circuit portion;
    at least one of a first protective transistor provided between the first power-source line and the second power-source line and a second protective transistor provided between the first ground line and the second ground line;
    third protective transistors respectively disposed at at least two of a position between the first power-source line and the third power-source line, a position between the first ground line and the third ground line, a position between the first power-source line and the third ground line, and a position between the first ground line and the third power-source line;
    fourth protective transistors disposed at at least two of a position between the second power-source line and the third power-source line, a position between the second ground line and the third ground line, a position between the second power-source line and the third ground line, and a position between the second ground line and the third power-source line; and
    a connection line for transferring an output signal of the first internal block as an input signal of the second internal block, wherein
        at least one of the first protective transistor and the second protective transistor is disposed in the vicinity of the connection line.

2. The electrostatic-breakdown-preventive and protective circuit for a semiconductor-device of claim 1, wherein
    a distance in each of the first protective transistor and the second protective transistor from a contact hole for connecting an impurity diffusion layer serving as a source and a drain of the protective transistors with a metallic wiring, to a gate of the protective transistor is shorter than a distance in each of the third and fourth protective transistors from a contact hole for connecting an impurity diffusion layer serving as a source and a drain of the protective transistor with a metallic wiring, to a gate of the protective transistor.

3. The electrostatic-breakdown-preventive and protective circuit for a semiconductor-device of claim 1, wherein:

at each of the first protective transistor and the second protective transistor, a compound layer of silicon and metal is formed on the entirety of a surface between a contact hole for connecting an impurity diffusion layer serving as a source and a drain with a metallic wiring, and a gate; and at each of the third and fourth protective transistors, a region, where no compound layer of silicon and metal is formed, is provided between a contact hole for connecting an impurity diffusion layer serving as a source and a drain with a metallic wiring, and a gate.

4. The electrostatic-breakdown-preventive and protective circuit for a semiconductor-device of claim 1, wherein the distance in each of the first protective transistor and the second protective transistor from the contact hole for connecting the impurity diffusion layer serving as the source and the drain of the protective transistor with a metallic wiring, to the gate of the protective transistor has a minimum value possible in a fabrication process.

5. An electrostatic-breakdown-preventive and protective circuit for a semiconductor-device, the circuit comprising:

a first power-source line and a first ground line for supplying bias to a first internal block;

a second power-source line and a second ground line for supplying bias to a second internal block;

a third power-source line and a third ground line for supplying bias to an input/output circuit portion;

first protective transistors respectively disposed at at least two of a position between the first power-source line and the third power-source line, a position between the first ground line and the third ground line, and a position between the first power-source line and the third ground line, a position between the first ground line and the third power-source line;

second protective transistors respectively disposed at at least two of a position between the second power-source line and the third power-source line, a position between the second ground line and the third ground line, a position between the second power-source line and the third ground line, and a position between the second ground line and the third power-source line;

a connection line for transferring an output signal of the first internal block as an input signal of the second internal block; and at least one of a first resistor whose one end is connected to the first power-source line and whose other end is connected to the second power-source line and a second resistor whose one end is connected to the first ground line and whose other end is connected to the second ground line, wherein at least one of the first resistor and the second resistor is disposed in the vicinity of the connection line.

6. An electrostatic-breakdown-preventive and protective circuit for a semiconductor-device, the circuit comprising:

a first power-source line and a first ground line for supplying bias to a first internal block;

a second power-source line and a second ground line for supplying bias to a second internal block;

a third power-source line and a third ground line for supplying bias to an input/output circuit portion;

at least one of a first protective element provided between the first power-source line and the second power-source line and a second protective element provided between the first ground line and the second ground line;

first protective transistors respectively disposed at at least two of a position between the first power-source line and the third power-source line, a position between the first ground line and the third ground line, a position between the first power-source line and the third ground line, and a position between the first ground line and the third power-source line;

second protective transistors respectively disposed at at least two of a position between the second power-source line and the third power-source line, a position between the second ground line and the third ground line, a position between the second power-source line and the third ground line, and a position between the second ground line and the third power-source line; and a connection line for transferring an output signal of the first internal block as an input signal of the second internal block, wherein at least one of the first protective element and the second protective element is disposed in the vicinity of the connection line.

7. The electrostatic-breakdown-preventive and protective circuit for a semiconductor-device of claim 6, wherein the first and second protective elements are the third and fourth protective transistors.

8. The electrostatic-breakdown-preventive and protective circuit for a semiconductor-device of claim 7, wherein a distance in each of the third protective transistor and the fourth protective transistor from a contact hole for connecting an impurity diffusion layer serving as a source and a drain of the protective transistor with a metallic wiring, to the gate of the protective transistor is shorter than a distance in each of the first protective transistor and the second protective transistor from a contact hole for connecting an impurity diffusion layer serving as a source and a drain of the protective transistor with a metallic wiring, to the gate of the protective transistor.

9. The electrostatic-breakdown-preventive and protective circuit for a semiconductor-device of claim 7, wherein:

at each of the third protective transistor and the fourth protective transistor, a compound layer of silicon and metal is formed on the entirety of a surface between a contact hole for connecting an impurity diffusion layer serving as a source and a drain with a metallic wiring, and a gate; and at each of the first and the second protective transistors, a region, where no compound layer of silicon and metal is formed, is provided between a contact hole for connecting an impurity diffusion layer serving as a source and a drain with a metallic wiring, and a gate.

10. The electrostatic-breakdown-preventive and protective circuit for a semiconductor-device of claim 7, wherein the distance in each of the third protective transistor and the fourth protective transistor from an impurity diffusion layer serving as a source and a drain of the protective transistor with a metallic wiring, to the gate of the protective transistor has a minimum value possible in a fabrication process.

11. The electrostatic-breakdown-preventive and protective circuit for a semiconductor-device of claim 6, wherein the first and second protective elements are resistors.

* * * * *